Figure 1:
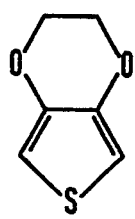

United States Patent [19]

Mutsaers et al.

[11] Patent Number: 5,447,824
[45] Date of Patent: Sep. 5, 1995

[54] METHOD OF MANUFACTURING A PATTERN OF AN ELECTRICALLY CONDUCTIVE POLYMER ON A SUBSTRATE SURFACE AND METHOD OF METALLIZING SUCH A PATTERN

[75] Inventors: Cornelius M. J. Mutsaers; Dagobert M. De Leeuw; Maurice M. J. Simenon, all of Eindhoven, Netherlands

[73] Assignee: U.S. Philips Corporation, New York, N.Y.

[21] Appl. No.: 207,560

[22] Filed: Mar. 7, 1994

[30] Foreign Application Priority Data
Sep. 3, 1993 [EP] European Pat. Off. ... 93200665.3

[51] Int. Cl.6 ............................ G03F 7/20; H01B 1/06
[52] U.S. Cl. ..................... 430/315; 430/311; 430/313; 430/330; 252/500
[58] Field of Search ............... 430/311, 313, 315, 317, 430/318, 330; 252/500, 501.1, 518, 519

[56] References Cited
U.S. PATENT DOCUMENTS
5,198,153 3/1993 Angelopoulos .................. 252/500
5,306,443 4/1994 Kaneko ............................ 252/518

FOREIGN PATENT DOCUMENTS
0399299 11/1990 European Pat. Off. .

*Primary Examiner*—Kathleen Duda
*Attorney, Agent, or Firm*—Ernestine C. Bartlett

[57] ABSTRACT

A solution of monomers, oligomers or polymers and a suitable oxidation agent can be stable if the solution also comprises a base. By spin coating this solution onto a substrate, a layer can be formed which, after patterned irradiation, yields a pattern of a doped conductive polymer which is formed in situ, the exposed and unexposed areas exhibiting a large difference in conductivity. A description is given of, inter alia, the patterned irradiation of a layer of 3,4-ethylenedioxythiophene. If desired, the conductive polymer pattern can subsequently be metallized in an electroplating bath. The method provides, inter alia, a simple process of manufacturing metal patterns on insulating substrates, such as printed circuit boards.

13 Claims, 1 Drawing Sheet

METHOD OF MANUFACTURING A PATTERN OF AN ELECTRICALLY CONDUCTIVE POLYMER ON A SUBSTRATE SURFACE AND METHOD OF METALLIZING SUCH A PATTERN

The invention relates to a method of manufacturing a pattern of an electrically conductive polymer on a substrate surface, a solution from which the conductive polymer is formed being provided on the substrate surface as a liquid layer, after which said liquid layer is optionally dried, exposed to patterned radiation and then heated, thereby forming the pattern of electrically conductive polymer. The invention also relates to the metallization of such a pattern.

In general, organic polymers are electrical insulators and are therefore used as insulation material in electrical and electronic components. It is known that the polymer can become electrically conductive if it comprises a poly-conjugated bond system consisting of a chain of, for example, double bonds, triple bonds, aromatic or hetero-aromatic rings. This conductivity is referred to as intrinsic conductivity. Examples of such polymers are polyacetylene, polythiophene and polypyrrole. The conductivity of these polymers is generally low, since said polymers are semiconductors with a relatively large band gap of 1.5-4 eV. The conductivity can be increased by, for example, (electro)chemically oxidizing the polymer, termed doping, resulting in the formation of p-type conductors. Suitable flopants for obtaining p-type conductance are, for example, $I_2$, $AsF_5$, $SbF_5$, $HBF_4$, perchlorates, sulphonates, $SO_3$ and $FeCl_3$. This doping causes the formation of positive charge carriers on the polymer chains, which charges are compensated by negatively charged counterions.

In general, polymers are cheap and can be provided on a substrate by means of simple techniques, such as spin coating. Consequently, conductive polymers are attractive for use in conductive and semiconductive structures in (integrated) electronic circuits, printed circuit boards, anti-static coatings and electromagnetic protective layers. To realise completely organic electronic systems, interconnects based on conductive polymers must be available.

A method of manufacturing a pattern of an electrically conductive polymer is known from European Patent Application EP-A-399299. In said known method, a mixture of a conjugated polymer, such as polyaniline, a radiation-sensitive onium salt and a solvent is provided on a substrate surface. After heating, the substrate surface is exposed to patterned radiation with, for example, UV light and heated again. An example of an onium salt is triphenylsulphonium hexafluoroantimonate. As a result of said exposure to radiation, the onium salt generates free acid which protonates the polymer, thereby forming a conductive polymer having negative ions as counterions. The known method is a positive process. The exposed areas of the polymer layer become electrically conductive, whereas the non-exposed areas remain electrically non-conductive. The unexposed areas are removed by treating them with a suitable solvent.

A drawback of the known method is that the specific conductivity of the conductive polymer formed is too low, so that said conductive polymer cannot be used as an interconnect in electronic circuits. The stated maximum conductivity values are 0.01-0.1 S/cm. This specific conductivity is also too low to provide, if desired, by electroplating polymer layers of a customary small layer thickness with a metal layer of, for example, copper for use in printed circuit boards.

It is an object of the invention to provide, inter alia, a simple method of manufacturing an electrically conductive polymer pattern, which method is a negative process in which the specific conductivity of the conductive parts of the polymer pattern is higher than 0.1 S/cm and the specific conductivity of the other ("non-conductive") parts of the polymer pattern is at least a factor of $10^4$ lower, and in which the conductive polymer pattern can be galvanically re-inforced with a metal layer.

According to the invention, this object is achieved by a method as described in the opening paragraph, which is characterized in that the solution also comprises an oxidation agent and a base, and in that conductive polymer is formed in the unexposed areas and non-conductive polymer is formed in the exposed areas. Non-conductive polymer is to be understood to mean herein, a polymer whose specific conductivity is at least a factor of $10^4$ lower than the specific conductivity of the conductive polymer. The presence of an oxidation agent causes the specific conductivity values of the polymers formed to be higher than they would be if no oxidation agent were used. However, solutions comprising monomers or undoper oligomers or polymers and, in addition, typical oxidation agents used for doping, such as Fe(III) salts, are very unstable. When these components are mixed, instantaneously doped polymers are formed in the solution, so that the formation of a conductive polymer pattern on a substrate is impossible. Surprisingly, it has been found that the reaction rate of the polymerization reaction and/or doping reaction is lowered by adding small quantities of a base to the solution. Depending on the concentration of the base, the reaction can be suppressed completely at room temperature. An effective base concentration enables solutions comprising monomers, oligomers or polymers and a suitable oxidation agent to remain stable, at least at room temperature, for approximately 12 hours: no polymerization takes place. These stable solutions enable thin layers to be provided on a substrate by means of, for example, spin coating. Following the heating of the layer, an electrically conductive polymer is formed. If the spin coated layer of monomers or oligomers is exposed, prior to heating, to for example UV light, surprisingly, a non-conductive polymer is formed after heating. If the spin coated layer is partially exposed, conductive polymer is formed, after heating, in the unexposed areas and non-conductive polymer (i.e. having a specific conductivity which is at least a factor of $10^4$ lower) is formed in the exposed areas. Patterned irradiation via, for example, a mask results, in accordance with this method, in conductive polymer patterns in the unexposed areas and areas of insulating polymer in the exposed areas. Thus, the process conducted in this manner is a negative process: the exposed areas become non-conductive. Unlike other known methods, the manufacture of a conductive polymer pattern in accordance with the invention does not require a separate photoresist layer. As the conductive and non-conductive areas of the polymer layer are situated in one plane, a separate planarization layer is not necessary to further finish, for example, an electronic circuit.

Suitable monomers for the method in accordance with the invention are aromatic compounds, such as aniline and heterocyclic aromatic compounds, such as pyrrole, furan and thiophene. To increase the solubility and improve the processability, the monomers can be substituted with, for example, alkyl groups or alkoxy groups. An example of such a compound is 3-dodecyl-thiophene. Suitable oligomers are, for example, terthiophene and α, α'-coupled undecathiophene substituted with four dodecyl side chains, referred to in literature as $T_{12}d_4(2,5,8,11)$, i.e. 12 thiophene rings ($T_{12}$) with 4 dodecyl side chains ($d_4$) on the rings 2,5,8 and 11. Oligomers of thiophene can more easily be doped than thiophene itself. Suitable polymers for the method in accordance with the invention are, for example, substituted or unsubstituted polyaniline and polythiophene.

Suitable oxidation agents for the method in accordance with the invention are, for example, soluble Fe(III) salts, such as tris(toluenesulphonate)Fe(III), Cu(II)-salts, such as $Cu(BF_4)_2$, Ce(IV)-salts and Cr(III)-salts. A suitable organic oxidation agent is, for example, 2,3-dichloro-5,6-dicyanoparabenzoquinone (DDQ). The choice of the oxidation agent depends on the redox potential of the monomer, oligomer or polymer used. In order to be able to suppress the polymerization/doping reaction at room temperature, the redox potentials of the oxidation agent and the monomer, oligomer or polymer must not differ too much.

Suitable soluble bases for this method are, for example, imidazole, dicyclohexylamine and 1,8-diazabicyclo[5,4,0]undec-7-ene (DBU).

A suitable embodiment of the method in accordance with the invention is characterized in that 3,4-ethylenedioxythiophene is used as the monomer. A solution of 3,4-ethylenedioxythiophene (EDOT), a suitable base quantity and an Fe(III)-salt as the oxidation agent is stable at room temperature. A layer of this solution can be provided on a substrate by spin coating. Optionally the layer is subsequently dried and exposed to patterned radiation. The polymerization reaction is initiated by heating to approximately 110° C., resulting in the formation of a conductive polymer having a high specific conductivity of 300 S/cm in the unexposed areas and a non-conductive polymer (specific conductivity $10^{-3}$ S/cm) in the areas exposed to deep UV light. Following the exposure and heating of the layer, the layer is extracted with, for example, methanol or 1-butanol. This extraction causes the reduced oxidation agent, for example the Fe(II)-salt formed, to be removed from the layer. The above-mentioned conductivity and difference in conductivity between exposed and unexposed areas of at least a factor of $10^4$ are sufficient for the use as interconnect and for a possible galvanic reinforcement with a metal layer. Layers of conductive poly-3,4-ethylenedioxythiophene are stable when they are exposed to UV light ($\lambda > 300$ nm). The temperature stability of this conducting polymer is much better than that of other known polymers. Besides, this conductive polymer hardly absorbs visible light, so that this polymer can suitably be used as a transparent conductor. The ethylene group of EDOT can be substituted with $C_1-C_{12}$ the above-mentioned alkyl groups or alkoxy groups. Also oligomers of EDOT, whether or not substituted, can be used in the method in accordance with the invention, an example of such an oligomer being the tetramer of $EDOT-C_6H_{13}$.

The specific conductivity of the conductive polymer pattern and the difference in conductivity between exposed and unexposed areas of at least a factor of $10^4$ are such that a metal layer can be grown on this pattern in an electroplating bath. Consequently, the method in accordance with the invention can particularly suitably be used for the manufacture of metal tracks on insulating substrate surfaces, such as printed circuit boards. The metal layer to be provided may for example consist of silver, copper, nickel or chromium. For this purpose, customary, commercially available electroplating baths of simple composition can be used. In this manner, the use of electroless metallization baths is circumvented. Electroless metallization baths have the drawback that expensive noble metals (mostly palladium) are required to activate the substrate surface and that the metallization baths used readily become unstable. Besides, toxic reducing agents, such as formaldehyde, are often used in said baths. A further drawback of the standard electroless method is that the activation is non-selective, so that the deposited uniform metal layer must subsequently be patterned photolithographically and by means of chemical etching, which is a very time-consuming process. The method in accordance with the invention makes it possible to provide conductive metal patterns of, for example, copper on an electrically insulating substrate in a simple manner by means of electrodeposition. For the substrate use can be made of synthetic resins, glass, quartz and ceramics.

Figure 2:
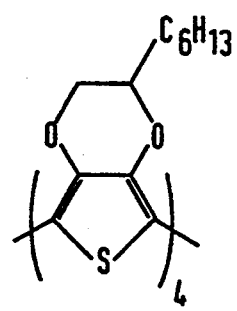
Figure 3:
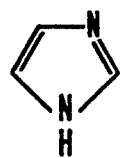

The invention will be explained in greater detail by means of exemplary embodiments and drawings, in which FIG. 1 shows the structural formula of 3,4-ethylenedioxythiophene (EDOT), FIG. 2 shows the structural formula of the tetramer of $EDOT-C_6H_3$, and FIG. 3 shows the formula of imidazole.

Exemplary embodiment 1.

A quantity of 0.35 mmol 3,4-ethylenedioxythiophene (EDOT, supplier Bayer AG, formula see FIG. 1) is mixed with a solution of 0.81 mmol tris(toluenesulphonate)Fe(III) and 0.25 mmol imidazole (formula see FIG. 3) in 1.5 g 1-butanol. The solution obtained is stable for approximately 12 hours at room temperature. After filtration through a 0.5 µm filter, the solution is spin coated onto a silicon substrate. The layer obtained is dried at 50° C. for 3 minutes. The dried layer is exposed, via a mask, to patterned radiation with UV light ($\lambda < 300$ nm) by means of a Hg lamp and, subsequently, heated to 110° C. for 1 minute. After cooling, the Fe(II)-salt formed is extracted from the layer by means of 1-butanol. After extraction, the average layer thickness is 650 Å. The unexposed parts of the layer form a track pattern having a track width of up to 1 µm and comprise electrically conductive poly-3,4-ethylenedioxythiophene having a specific electric conductivity of 300 S/cm. The exposed parts of the layer comprise a non-conductive polymer having a specific conductivity of only $10^{-2}-10^{-4}$ S/cm. Thus, this embodiment of the method is a negative process.

Both the conductive and the non-conductive polymers are transparent to visible light; thus, this embodiment of the invention yields transparent conductors. The conductive polymer which is doped in situ is surrounded by areas of non-conductive polymer, rendering further planarization steps superfluous. The conductive patterns are stable in UV light ($\lambda > 300$ nm) and, besides, have a higher thermal stability than the conductive polymers known to date. After heating for 3 hours at 100° C., the specific conductivity is 200 S/cm, while heating for the same period of time at 150° C. causes the specific conductivity to decrease only to 50 S/cm. After heating for only 1 minute at 110° C., the dopant is completely removed from the conductive polymer of, for example, the thiophene oligomer $T_{12}$.

Exemplary embodiment 2.

A solution is prepared which consists of 0.055 mmol of the tetramer of EDOT-$C_6H_{13}$ (formula see FIG. 2), 0.037 mmol 1,4-benzoquinone, 0.163 mmol orthonitrobenzyltosylate in 1.5 g tetrahydrofuran. The solution is spin coated onto a substrate and dried for 1 minute at 90° C. The layer is exposed to patterned radiation with UV light ($\lambda < 300$ nm). After heating for 2 minutes at 140° C. the specific conductivity of the unexposed areas is 10 S/cm, whereas the exposed areas remain electrically insulating (resistance $> 10^9/\square$; specific conductivity $10^{-5}$ S/cm). This method enables conductive polymer patterns having a line width of 5 $\mu$m to be obtained.

Exemplary embodiment 3.

A solution is prepared which consists of 0.35 mmol 3,4-ethylenedioxythiophene, 0.25 mmol imidazole and 0.81 mmol tris(toluenesulphonate)Fe(III) in 1.5 g 1-butanol. After filtration through a 0.5 $\mu$m filter, the solution is spin coated onto a beaded PMMA (polymethyl methacrylate) substrate. The layer obtained has a thickness of approximately 1 $\mu$m. Parts of the layer are exposed to deep UV light ($\lambda < 300$ nm). Subsequently, the layer is polymerized to poly-3,4-ethylenedioxythiophene by heating at 110° C. for 1 minute. After cooling, the layer is extracted with 1-butanol, causing the layer thickness to decrease to 700-1000 Å. The unexposed areas of the layer have a resistance of 0.4 k$\Omega/\square$. The exposed areas of the layer have a conductivity which is at least a factor of $10^4$ lower. The layer is then copper-plated in an aqueous copper bath containing 0.5 molar $CuSO_4$ and 0.5 molar $H_2SO_4$ at room temperature. The current density is 0.1 A/cm$^2$. Copper is deposited only on the conductive (i.e. unexposed) parts of the polymer layer. The copper layer bonds very well to the polymer layer.

The method in accordance with the invention enables polymer patterns to be manufactured in a polymer layer, the specific conductivity of the conductive parts of the polymer pattern being at least 0.1 S/cm and being a factor of $10^4$ higher than the specific conductivity of the non-conductive pans. In accordance with the invention, the conductive polymer pattern can be galvanically provided with a metal layer, thereby forming a corresponding metal pattern. Thus, the method in accordance with the invention can very suitably be used for the additive manufacture of metal patterns and, hence, is a favouable alternative to electroless metallization.

We claim:

1. A method of manufacturing a pattern of an electrically conductive polymer on a substrate surface, said method comprising:
   a) forming a liquid layer on a surface of said substrate from a solution containing a material capable of forming said electrically conductive polymer upon being heated, an oxidizing agent and a base,
   b) exposing said liquid layer to patterned radiation, and
   c) heating said layer thereby forming a pattern of an electrically conductive polymer, said conductive polymer being formed in unexposed areas and a non-conductive polymer being formed in the exposed areas of the layer.

2. The method of claim 1 wherein the liquid layer is dried before being exposed to radiation.

3. A method as claimed in claim 2, characterized in that poly-3,4-ethylenedioxythiophene is used as the polymer resulting from 3,4-ethylenedioxythiophene monomers in the solution.

4. A method as claimed in claim 3 wherein an Fe(III)-salt is used as the oxidation agent.

5. A method as claimed in claim 3 wherein imidazole is used as the base.

6. A method as claimed in claim 3 wherein an electroplating bath is used to provide a metal layer on the conductive polymer pattern.

7. A method as claimed in claim 2, characterized in that an Fe(III)-salt is used as the oxidizing agent.

8. A method as claimed in claim 7 wherein imidazole is used as the base.

9. A method as claimed in claim 7 wherein an electroplating bath is used to provide a metal layer on the conductive polymer pattern.

10. A method as claimed in claim 2, characterized in that imidazole is used as the base.

11. A method as claimed in claim 10 wherein an electroplating bath is used to provide a metal layer on the conductive polymer pattern.

12. A method as claim 2, characterized in that an electroplating bath is used to provide a metal layer on the conductive polymer pattern.

13. A method as claimed in claim 12, characterized in that copper, silver, nickel or chromium is used as the metal layer.

* * * * *